(12) United States Patent
Liu et al.

(10) Patent No.: US 11,785,811 B2
(45) Date of Patent: Oct. 10, 2023

(54) ARRAY SUBSTRATE COMPRISING AN INTERLAY INSULATION LAYER INCLUDING AT LEAST TWO INORGANIC INSULATION LAYERS AND AT LEAST ONE ORGANIC INSULATION LAYER LAMINATED ONE ON ANOTHER

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Ning Liu, Beijing (CN); Jun Liu, Beijing (CN); Wei Song, Beijing (CN); Qinghe Wang, Beijing (CN); Bin Zhou, Beijing (CN); Liangchen Yan, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 116 days.

(21) Appl. No.: 17/241,703

(22) Filed: Apr. 27, 2021

(65) Prior Publication Data
US 2021/0367017 A1 Nov. 25, 2021

(30) Foreign Application Priority Data
May 20, 2020 (CN) .......................... 202010428682.1

(51) Int. Cl.
*H01L 29/08* (2006.01)
*H10K 59/124* (2023.01)
(Continued)

(52) U.S. Cl.
CPC ......... *H10K 59/124* (2023.02); *H10K 59/126* (2023.02); *H10K 59/1201* (2023.02)

(58) Field of Classification Search
CPC ............. H01L 27/3258; H01L 27/3272; H01L 2227/323
(Continued)

(56) References Cited

U.S. PATENT DOCUMENTS

2005/0029926 A1 2/2005 Park et al.
2006/0119262 A1* 6/2006 Ikeda .................. H01L 51/5088
313/506
(Continued)

FOREIGN PATENT DOCUMENTS

CN 1604702 A 4/2005
CN 109742091 A 5/2019
(Continued)

OTHER PUBLICATIONS

First Office Action for Chinese Application No. 202010428682.1, dated Sep. 20, 2022, 9 Pages.

*Primary Examiner* — Phuc T Dang
(74) *Attorney, Agent, or Firm* — BROOKS KUSHMAN P.C.

(57) ABSTRACT

An array substrate, a method for manufacturing the array substrate and a display device are provided. The array substrate includes: a base substrate, and a thin film transistor, a storage capacitor, and a lapping pattern for connecting the thin film transistor to the storage capacitor arranged on the base substrate; wherein the thin film transistor includes a semiconductor layer, a gate insulation layer, a gate electrode, an interlayer insulation layer, a source electrode and a drain electrode arranged sequentially in that order; the interlayer insulation layer includes at least two inorganic insulation layers and at least one organic insulation layer laminated one on another, and both a layer proximate to the base substrate (Continued)

and a layer distal to the base substrate in the interlayer insulation layer are the inorganic insulation layers.

18 Claims, 6 Drawing Sheets

(51) Int. Cl.
*H10K 59/126* (2023.01)
*H10K 59/12* (2023.01)

(58) Field of Classification Search
USPC .......................................................... 257/40
See application file for complete search history.

(56) References Cited

U.S. PATENT DOCUMENTS

| | | |
|---|---|---|
| 2008/0237585 A1 | 10/2008 | Kim |
| 2012/0168764 A1 | 7/2012 | Kim |
| 2013/0235292 A1 | 9/2013 | Hara et al. |
| 2014/0027736 A1 | 1/2014 | You et al. |
| 2014/0346604 A1 | 11/2014 | Lee et al. |
| 2015/0138475 A1 | 5/2015 | Kohara et al. |
| 2021/0043714 A1 | 2/2021 | Wang et al. |

FOREIGN PATENT DOCUMENTS

| | | | | |
|---|---|---|---|---|
| EP | 2963682 A1 * | 1/2016 | ............. | H01L 24/48 |
| JP | 2017161920 A | 9/2017 | | |

* cited by examiner

ARRAY SUBSTRATE COMPRISING AN INTERLAY INSULATION LAYER INCLUDING AT LEAST TWO INORGANIC INSULATION LAYERS AND AT LEAST ONE ORGANIC INSULATION LAYER LAMINATED ONE ON ANOTHER

CROSS-REFERENCE TO RELATED APPLICATION

This application claims priority to Chinese Patent Application No. 202010428682.1 filed on May 20, 2020, the disclosure of which is incorporated herein by reference in its entirety.

TECHNICAL FIELD

Embodiments of the present disclosure relate to the field of display technologies, in particular to an array substrate, a method for manufacturing the array substrate and a display device.

BACKGROUND

Due to the characteristics of a short channel, an on-state current (Ion) of a top-gate thin film transistor (TFT) can be effectively increased, thereby significantly improving the display quality and effectively reducing the power consumption. In addition, an overlapping area between a gate electrode and source and drain electrodes of the top-gate thin film transistor is small, and a resultant parasitic capacitance is small. Therefore, a probability of defects such as a gate-drain short (GDS) occurring is also reduced. The top-gate thin-film transistor has received attention by virtue of the above-mentioned significant advantages.

SUMMARY

An array substrate, a method for manufacturing the array substrate and a display device are provided in the embodiments of the present disclosure.

In a first aspect, an array substrate is provided, including: a base substrate, and a thin film transistor, a storage capacitor and a lapping pattern arranged on the base substrate, wherein the lapping pattern is configured for connecting the thin film transistor to the storage capacitor. The thin film transistor includes a semiconductor layer, a gate insulation layer, a gate electrode, an interlayer insulation layer, a source electrode and a drain electrode arranged sequentially in that order; the interlayer insulation layer includes at least two inorganic insulation layers and at least one organic insulation layer laminated one on another, and both a layer proximate to the base substrate and a layer distal to the base substrate in the interlayer insulation layer are the inorganic insulation layers.

Optionally, the interlayer insulation layer includes a first inorganic insulation layer, an organic insulation layer and a second inorganic insulation layer laminated one on another in that order.

Optionally, the storage capacitor includes: a first electrode and a second electrode, the second electrode is arranged on a side of the first electrode distal to the base substrate, the source electrode is connected to the first electrode, and the second electrode is arranged at a same layer as the semiconductor layer.

Optionally, the lapping pattern is arranged at a same layer as the source electrode and the drain electrode, and connected to the gate electrode and the second electrode through an interlayer insulation layer via-hole in the interlayer insulation layer, the interlayer insulation layer via-hole is composed of a first via-hole and a second via-hole that are connected to each other, the lapping pattern is lapped with the gate electrode through the first via-hole, and the lapping pattern is lapped with the second electrode through the second via-hole.

Optionally, the first electrode is provided with a first hollowed-out pattern, and an orthographic projection of the first hollowed-out pattern onto the base substrate at least partially overlaps an orthographic projection of the second via-hole onto the base substrate.

Optionally, the orthographic projection of the first hollowed-out pattern onto the base substrate partially overlaps an orthographic projection of the first via-hole onto the base substrate.

Optionally, the array substrate further includes: a light-shielding layer, arranged on a side of the semiconductor layer proximate to the base substrate, where an orthographic projection of the semiconductor layer onto the base substrate is located within an orthographic projection of the light-shielding layer onto the base substrate, the first electrode is lapped with the light-shielding layer, the light-shielding layer is provided with a second hollowed-out pattern, an orthographic projection of the second hollowed-out pattern onto the base substrate at least partially overlaps the orthographic projection of the second via-hole onto the base substrate.

Optionally, the orthographic projection of the second hollowed-out pattern onto the base substrate partially overlaps an orthographic projection of the first via-hole onto the base substrate.

Optionally, the first hollowed-out pattern penetrates through the first electrode, the second hollowed-out pattern penetrates through the light-shielding layer, and the orthographic projection of the first hollowed-out pattern onto the base substrate at least partially overlaps the orthographic projection of the second hollowed-out pattern onto the base substrate.

In a second aspect, a method for manufacturing an array substrate is provided, including: providing a base substrate; forming a first electrode of a storage capacitor on the base substrate; forming a buffer layer; forming a semiconductor layer and a second electrode of the storage capacitor arranged at a same layer; forming a gate insulation layer; forming a gate electrode; forming an interlayer insulation layer including at least two inorganic insulation layers and at least one organic insulation layer laminated one on another, wherein both a layer proximate to the base substrate and a layer distal to the base substrate in the interlayer insulation layer are the inorganic insulation layers; forming an interlayer insulation layer via-hole and a connection hole, wherein the interlayer insulation layer via-hole penetrates through the interlayer insulation layer, the connection hole penetrates through the interlayer insulation layer and the buffer layer, the interlayer insulation layer via-hole is composed of a first via-hole and a second via-hole that are connected to each other, a lapping pattern is lapped with the gate electrode through the first via-hole, and the lapping pattern is lapped with the second electrode through the second via-hole; and forming a source electrode, a drain electrode and the lapping pattern, wherein at least part of the lapping pattern is located in the interlayer insulation layer via-hole, and configured for lapping the gate electrode and the second electrode, and the source electrode is connected to the first electrode through the connection hole.

Optionally, the interlayer insulation layer includes a first inorganic insulation layer, an organic insulation layer and a second inorganic insulation layer laminated one on another in that order.

Optionally, the forming the interlayer insulation layer via-hole and the connection hole includes: forming a photoresist pattern on the second inorganic insulation layer; etching the second inorganic insulation layer that is not covered by the photoresist pattern through an hydrofluoric acid (HF) wet etching process; and etching the organic insulation layer and the first inorganic insulation layer that are not covered by the photoresist pattern through a dry etching process, to form the connection hole and the interlayer insulation layer via-hole.

Optionally, the forming the first electrode of the storage capacitor on the base substrate includes: forming a first hollowed-out pattern in the first electrode, wherein an orthographic projection of the first hollowed-out pattern onto the base substrate at least partially overlaps an orthographic projection of the second via-hole onto the base substrate.

Optionally, prior to the forming the first electrode of the storage capacitor on the base substrate, the method further includes: forming a light-shielding layer, and forming a second hollowed-out pattern in the light-shielding layer, wherein the first electrode is lapped with the light-shielding layer, an orthographic projection of the second hollowed-out pattern onto the base substrate at least partially overlaps the orthographic projection of the first hollowed-out pattern onto the base substrate, and an orthographic projection of the semiconductor layer onto the base substrate is located within an orthographic projection of the light-shielding layer onto the base substrate.

In a third aspect, a display device is provided, including the above-mentioned array substrate.

BRIEF DESCRIPTION OF THE DRAWINGS

Through the detailed description mentioned hereinafter, the various other advantages and benefits will be apparent to a person skilled in the art. The following drawings are for illustrative purposes only, but shall not be construed as limiting the present disclosure. In the drawings, a same reference numeral represents a same member. In these drawings.

DETAILED DESCRIPTION

The technical solutions in the embodiments of the present disclosure will be described hereinafter clearly and completely with reference to the drawings of the embodiments of the present disclosure. Obviously, the following embodiments merely relate to a part of, rather than all of, the embodiments of the present disclosure, and based on these embodiments, a person skilled in the art may, without any creative effort, obtain other embodiments, which also fall within the scope of the present disclosure.

In the related art, a thick inter-layer insulation layer (e.g., an inter-layer Dielectric (ILD)) is usually used as an insulation layer between a gate electrode and source and drain electrodes in a top-gate active matrix organic light-emitting diode (AMOLED) product, so as to reduce a probability of defects such as a gate-drain short (GDS) occurring. Due to a large thickness, the inter-layer insulation layer cannot be etched successfully to form an interlayer insulation layer via-hole in a conventional dry etching process. Therefore, the ILD is typically etched to form a via-hole in a wet etching process by using hydrofluoric acid (HF) at present. In the related art, the inter-layer insulation layer is usually composed of a single-layer of inorganic material, so as to improve the insulation effect. However, the interlayer insulation layer formed by a single-layer of inorganic material is fragile, and an angle of a profile of the gate electrode underneath the interlayer insulation layer is large, so that the crack may occur in the part of the interlayer insulation layer outside a slope of the gate electrode, and an HF etching solution may etch the interlayer insulation layer downwardly along the crack. After a source-drain (SD) metal has been deposited in the interlayer insulation layer via-hole, a short circuit may occur between the gate electrode and an electrode that is underneath the gate electrode and used to form a storage capacitor, so that a driving thin film transistor may fail, and the storage capacitor (Cst) cannot be formed, thereby adversely affecting the display quality of the product.

In some embodiments of the present disclosure, an objective is to solve the problems that, in the top-gate AMOLED product in the related art, due to the fragile characteristic of the interlayer insulation layer, the interlayer insulation layer is easy to break at the position outside the slope of the gate electrode, so that a short circuit may occur between the gate electrode and the electrode of the storage capacitor that is underneath the gate electrode and used to form a storage capacitor, so that a driving thin film transistor may fail, and the storage capacitor cannot be formed.

Figure 1:
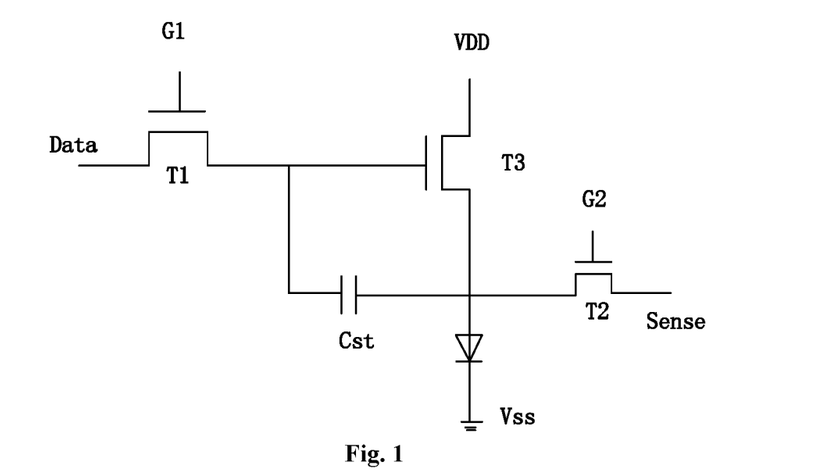
FIG. 1 is a schematic structural diagram of a circuit of a top-gate active matrix organic light-emitting diode (AMOLED) product.

Specifically, as shown in FIG. 1, a 3T1C structure including three thin film transistors (T1, T2 and T3) and a storage capacitor (Cst) is usually used as a circuit of the top-gate AMOLED product in the related art. T1 is a switching thin film transistor, T2 is a sensing thin film transistor, and T3 is a driving thin film transistor.

As the AMOLED product is gradually developing in a direction of large size and high resolution, more and more dense metal wires are required, which makes it very difficult to increase a pixel aperture ratio. In order to increase the pixel aperture ratio of the AMOLED product, various via-holes may be designed to be as compact as possible. A variety of inter-embedded hole designs are adopted in a latest AMOLED product.

Figure 2:
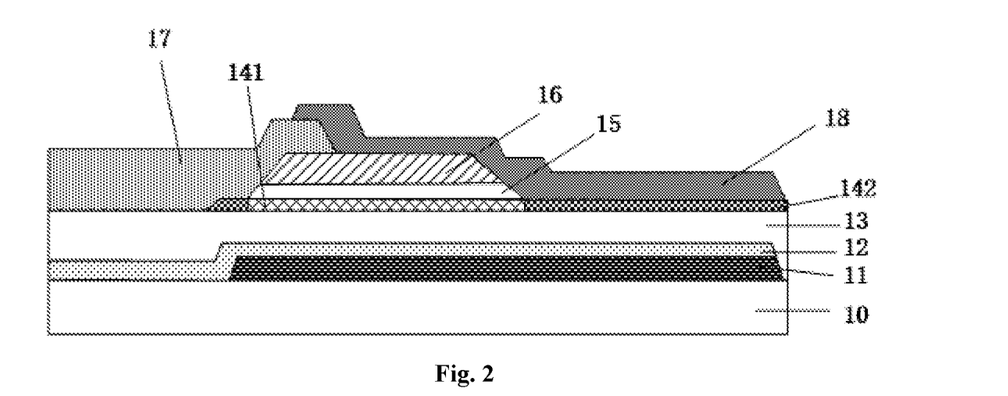
FIG. 2 is a schematic structural diagram of a top-gate AMOLED display substrate in the related art.

Referring to FIG. 2, which is a schematic structural diagram of a top-gate AMOLED display substrate in the related art. The display substrate includes: a base substrate 10, a light-shielding layer 11, a first electrode 12 of a storage capacitor, a buffer layer 13, a semiconductor pattern 141, a conductor pattern 142, a gate insulation layer 15, a gate electrode 16, an interlayer insulation layer 17 and a source-drain metal layer pattern 18. An interlayer insulation layer via-hole above the gate electrode 16 and an interlayer insulation layer via-hole above the conductor pattern 142 are connected and combined to form an inter-embedded hole. After the source-drain metal layer pattern 18 has been deposited in the inter-embedded hole, the gate electrode 16 of the driving thin film transistor and the conductor pattern 142 may be connected in series to form a second electrode of the storage capacitor.

Figure 4:
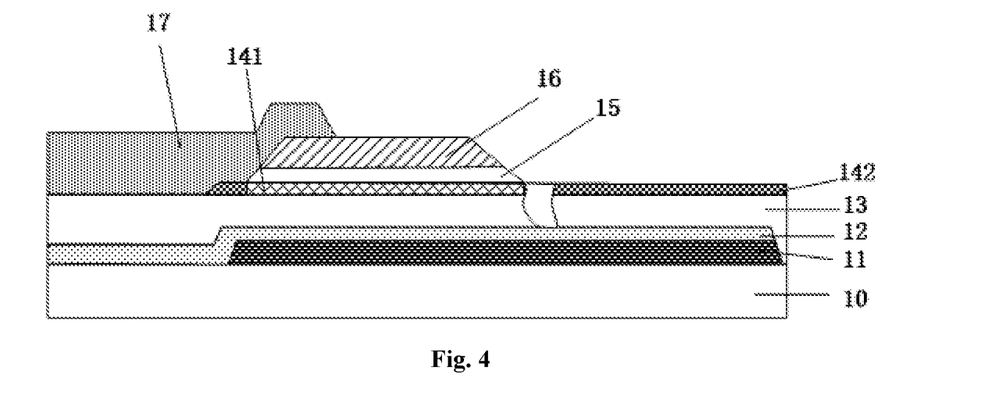
FIG. 4 is a schematic structural diagram of an interlayer insulation layer via-hole of the top-gate AMOLED display substrate in the related art.
Figure 5:
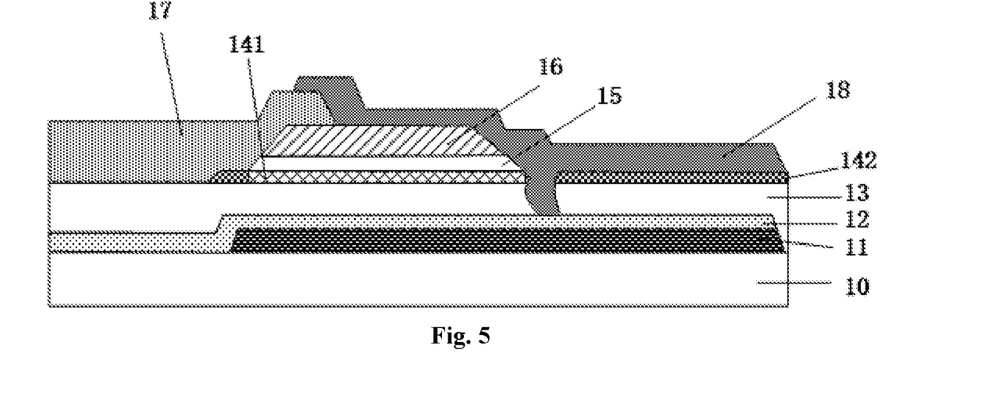
FIG. 5 is a schematic structural diagram of the top-gate AMOLED display substrate after a source-drain metal pattern is deposited in the interlayer insulation layer via-hole in the related art.

In order to reduce the probability of defects such as a gate-drain short (GDS) occurring and improve the product yield, a thick inter-layer insulation layer is currently used. However, such thick inter-layer insulation layer cannot be etched to form an interlayer insulation layer via-hole successfully in a conventional dry etching process. Therefore, the inter-layer insulation layer is typically etched to form a via-hole in a wet etching process by using hydrofluoric acid (HF) at present. In the related art, the inter-layer insulation layer is usually composed of a single-layer of inorganic material, so as to improve the insulation effect. However, the interlayer insulation layer formed by a single-layer of inorganic material is fragile, and an angle of a profile of the gate electrode underneath the interlayer insulation layer is large, so that the crack (referring to FIG. 3) may occur in the part of the interlayer insulation layer outside a slope of the gate electrode. During etching the inter-embedded hole by using the HF, an HF etching solution may etch the interlayer insulation layer downwardly along the crack to the first electrode 12 of the storage capacitor (please referring to FIG. 4). After the source-drain metal layer pattern 18 has been deposited, a short circuit may occur between the gate electrode and the first electrode 12 underneath the gate electrode (referring to FIG. 5), so that the driving thin film transistor may fail, and the storage capacitor (Cst) cannot be formed, thereby adversely affecting the display quality of the AMOLED product.

In order to solve the above problem, the film forming process of the interlayer insulation layer is adjusted in the embodiments of the present disclosure, so as to avoid such defect as a Gate-Source Short (GSS) caused by a case where the interlayer insulation layer is etched by the HF etching solution to an extent above the first electrode due to the crack in the interlayer insulation layer. Specifically, referring to FIG. 6, FIG. 7 and FIG. 8, an array substrate is provided in the embodiments of the present disclosure, which includes: a base substrate 20, and a thin film transistor 30, a storage capacitor 40, and a lapping pattern 281 for connecting the thin film transistor 30 to the storage capacitor 40 arranged on the base substrate 20, wherein the thin film transistor 30 includes a semiconductor layer 241, a gate insulation layer 25, a gate electrode 26, an interlayer insulation layer 27, a source electrode 282 and a drain electrode 283 arranged sequentially in that order, and the thin film transistor 30 is a top-gate thin film transistor.

Figure 6:
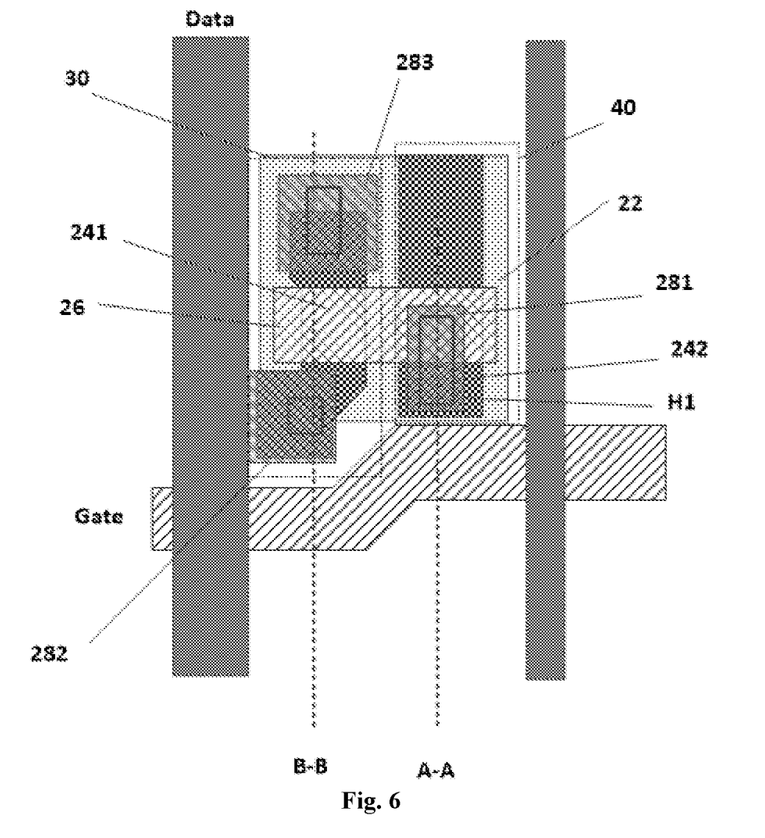
FIG. 6 is a top view of an array substrate according to an embodiment of the present disclosure.
Figure 7:
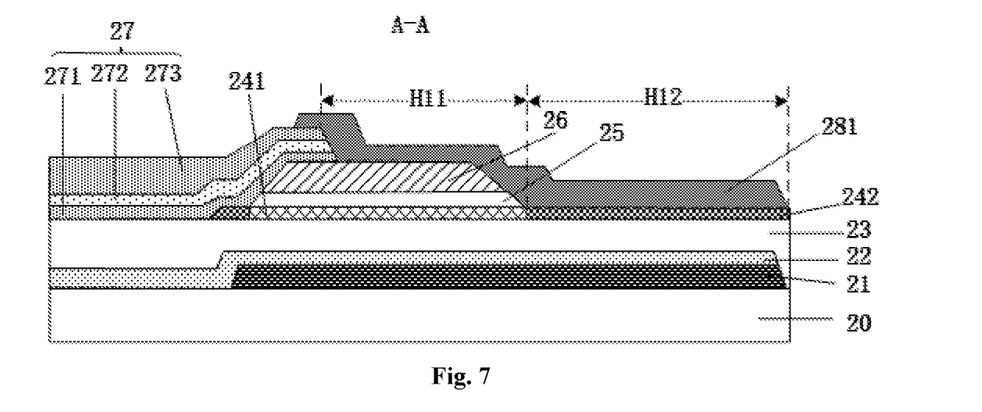
FIG. 7 is a cross-sectional view of the array substrate along a line A-A as shown in FIG. 6.
Figure 8:
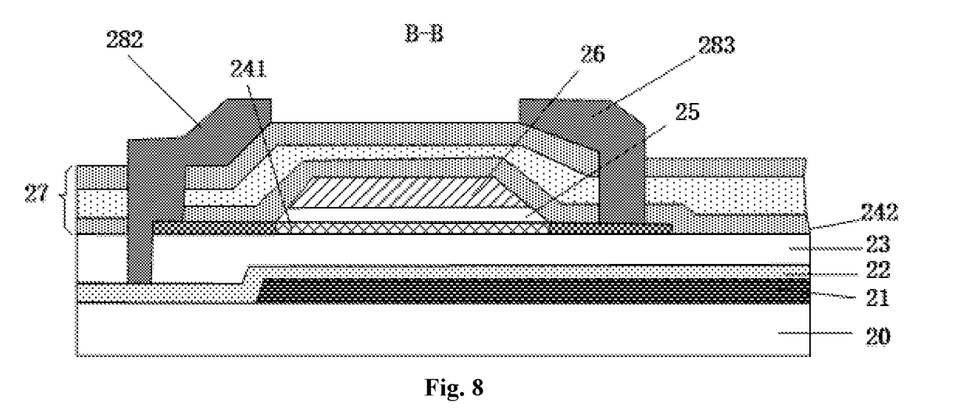
FIG. 8 is a cross-sectional view of the array substrate along a line B-B as shown in FIG. 6.

The storage capacitor 40 includes: a first electrode 22 and a second electrode 242, the second electrode 242 is arranged on a side of the first electrode 22 distal to the base substrate 20, the source electrode 282 is connected to the first electrode 22, and the second electrode 242 is arranged at a same layer as the semiconductor layer 241.

The lapping pattern 281 is arranged at a same layer as the source electrode 282 and the drain electrode 283, and connected to the gate electrode 26 and the second electrode 242 through an interlayer insulation layer via-hole H1 in the interlayer insulation layer 27, the interlayer insulation layer via-hole H1 is composed of a first via-hole H11 and a second via-hole H12 that are connected to each other, the lapping pattern 281 is lapped with the gate electrode 26 through the first via-hole H11, and the lapping pattern 281 is lapped with the second electrode 242 through the second via-hole H12. The interlayer insulation layer 27 includes a first inorganic insulation layer 271, an organic insulation layer 272 and a second inorganic insulation layer 273 laminated one on another.

Figure 3:
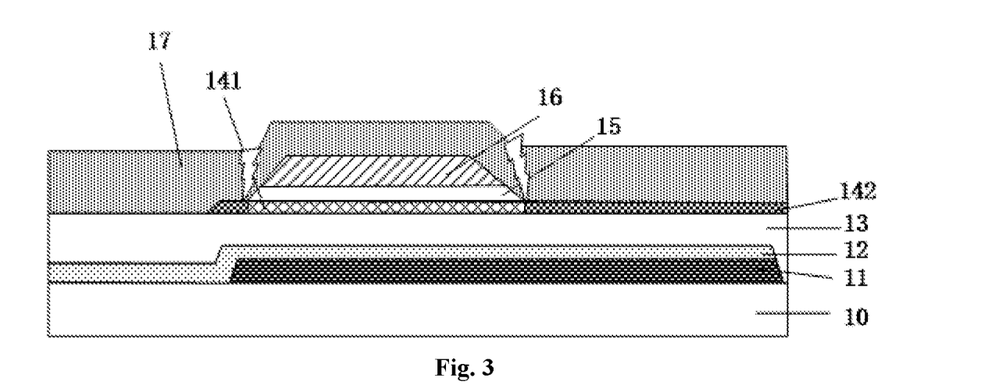
FIG. 3 is a schematic diagram of positions at which the crack occurs in the interlayer insulation layer of the top-gate AMOLED display substrate in the related art.

In the embodiment of the present disclosure, a multi-layer structure including inorganic insulation layers and an organic insulation layer is used in the interlayer insulation layer in a top-gate display substrate. The organic insulation layer is located between inorganic insulation layers. Due to good fluidity and flexibility of the organic insulation layer, the crack penetrating through the interlayer insulation layer at the position outside the slope of the gate electrode as shown in FIG. 3 may not occur. Even if the crack occurs in the inorganic insulation layer at the position outside the slope of the gate electrode, during etching a second inorganic insulation layer in a wet etching process, the HF etching solution may at the most reach the organic insulation layer and then be effectively blocked, so as to prevent the HF etching solution from etching the first electrode, and prevent a case shown in FIG. 4 from occurring. Then the organic insulation layer and the first inorganic insulation layer underneath the organic insulation layer may be etched in a dry etching process, so as to successfully form the crack-free interlayer insulation layer via-hole. After the lapping pattern has been deposited in the interlayer insulation layer via-hole, the GSS defect shown in FIG. 5 may not occur, thereby significantly improving the display quality of the product.

In the embodiment of the present disclosure, the interlayer insulation layer 27 may include a first inorganic insulation layer 271, an organic insulation layer 272 and a second inorganic insulation layer 273 laminated one on another in that order. It should be noted that, the interlayer insulation layer is not limited to the above structure. A structure of the interlayer insulation layer in the embodiments of the present disclosure only needs to meet the following conditions, i.e., the interlayer insulation layer includes at least two inorganic insulation layers and at least one organic insulation layer laminated one on another, and both a layer proximate to the base substrate and a layer distal to the base substrate in the interlayer insulation layer are each an inorganic insulation layer. In other words, both an uppermost layer and a lowermost layer in the interlayer insulation layer are each an inorganic insulation layer, so as to improve the insulation effect. The organic insulation layer is located therebetween, so as to prevent the crack penetrating through the interlayer insulation layer at the position outside the slope of the gate electrode from occurring, effectively block the HF etching solution, and prevent the HF etching solution from etching the first electrode.

In the embodiments of the present disclosure, optionally, the organic insulation layer may be an organic silicon insulation layer (SOG), which has good fluidity and flexibility.

In the embodiments of the present disclosure, optionally, the inorganic insulation layer may be made of silicon oxide (SiOx).

Figure 9:
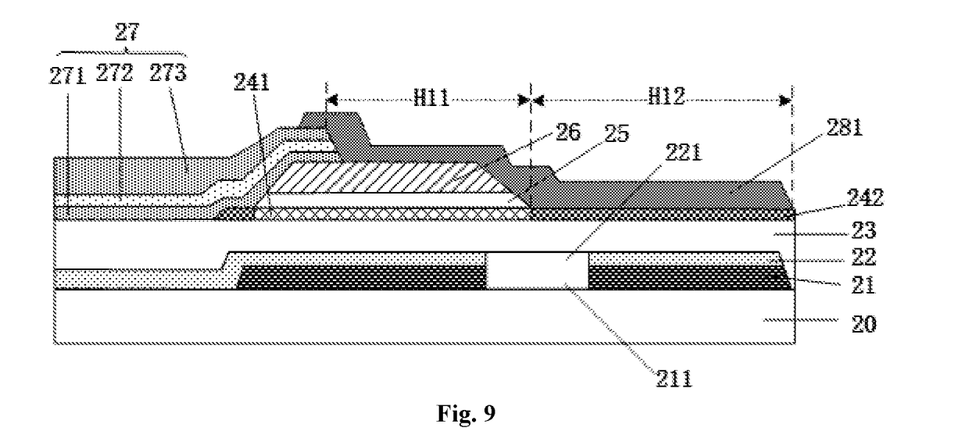
FIG. 9 is another cross-sectional view of the array substrate according to an embodiment of the present disclosure.
Figure 10:
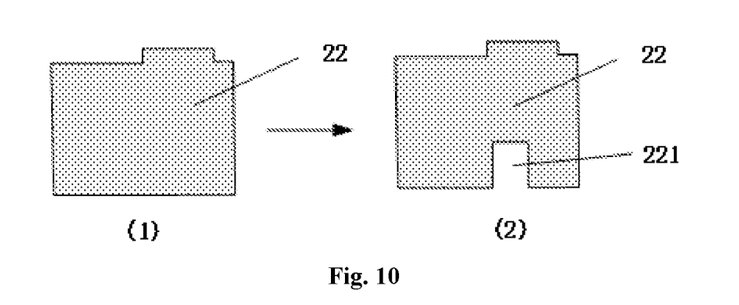
FIG. 10 is a top view of a first electrode of the array substrate according to an embodiment of the present disclosure.
Figure 11:
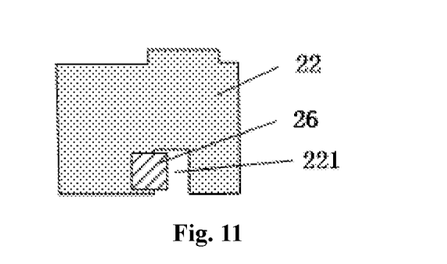
FIG. 11 is a top view of the first electrode and a gate electrode of the array substrate according to an embodiment of the present disclosure.

Referring to FIG. 9, FIG. 10 and FIG. 11, in another embodiment of the present disclosure, the first electrode 22 is provided with a first hollowed-out pattern 221, and an orthographic projection of the first hollowed-out pattern 221 onto the base substrate 20 at least partially overlaps an orthographic projection of the second via-hole H12 onto the base substrate 20. Optionally, the orthographic projection of the first hollowed-out pattern 221 onto the base substrate 20 partially overlaps an orthographic projection of the first via-hole H11 onto the base substrate 20. In addition, in a practical display panel product, a space where the first hollowed-out pattern 221 is located may be filled with a same material as a material of the buffer layer 23. The first hollowed-out pattern 221 may penetrate through the first electrode. In FIG. 10, the part (1) shows a first electrode without the first hollowed-out pattern, and the part (2) shows the first electrode with the first hollowed-out pattern. Since the first electrode 22 below the outer side of the sidewall of the gate electrode 26 that is lapped with the lapping pattern 281 has a hollowed-out structure, even if a crack penetrating through the interlayer insulation layer occurs at the position outside the sidewall of the gate electrode 26, and the HF etching solution reaches the first electrode 22 along the crack in the interlayer insulation layer, the subsequently deposited lapping pattern 281 may not be deposited on the first electrode 22, thereby avoiding the GSS.

In the embodiments of the present disclosure, optionally, the second electrode 242 is arranged at a same layer as the semiconductor layer 241, and the second electrode 242 is formed by subjecting the semiconductor thin film to a conduction-enabling process when the semiconductor layer 241 is manufactured.

In the embodiments of the present disclosure, optionally, the semiconductor thin film is made of a transparent semiconductor material such as Indium Gallium Zinc Oxide (IGZO), so that the conductive second electrode 242 is also a transparent electrode. Optionally, the first electrode 22 is also a transparent electrode, for example, the first electrode 22 is made of indium tin oxide (ITO), etc., so that the storage capacitor is a transparent capacitor, thereby improving the pixel aperture ratio.

In the embodiment of the present disclosure, the thin film transistor 30 is the top-gate thin film transistor. In a case that the semiconductor layer of the thin film transistor is a transparent semiconductor layer, optionally, as shown in FIG. 7, the array substrate further includes: a light-shielding layer 21, arranged on a side of the semiconductor layer 241 proximate to the base substrate, wherein an orthographic projection of the semiconductor layer 241 onto the base substrate 20 is located within an orthographic projection of the light-shielding layer 21 onto the base substrate 20, the first electrode 22 is lapped with the light-shielding layer 21.

Optionally, the light-shielding layer 21 is provided with a second hollowed-out pattern 211, an orthographic projection of the second hollowed-out pattern 211 onto the base substrate 20 at least partially overlaps the orthographic projection of the second via-hole H12 onto the base substrate 20. Optionally, the orthographic projection of the second hollowed-out pattern 211 onto the base substrate 20 partially overlaps an orthographic projection of the first via-hole H11 onto the base substrate 20. In addition, in a practical display panel product, a space where the second hollowed-out pattern 211 is located may be filled with a same material as the material of the buffer layer 23. The second hollowed-out pattern 211 may penetrate through the light-shielding layer 21. The orthographic projection of the second hollowed-out pattern 211 onto the base substrate 20 may coincide with or partially overlap the orthographic projection of the first hollowed-out pattern 221 onto the base substrate 20, so that even if the crack penetrating through the interlayer insulation layer occurs at the position outside the sidewall of the gate electrode 26, and the HF etching solution reaches the first electrode 22 along the crack in the interlayer insulation layer, the subsequently deposited lapping pattern 281 may not be deposited on the light-shielding layer 21, thereby avoiding the GSS.

A display device is further provided in the embodiments of the present disclosure, including the array substrate in any of the above embodiments.

Optionally, the display device is an AMOLED display device.

A method for manufacturing the array substrate is further provided in the embodiments of the present disclosure. A structure of the array substrate may refer to FIG. 7 and FIG. 8. The method includes the following steps.

Step 101, providing a base substrate 20.

Step 102, forming a first electrode 22 of a storage capacitor on the base substrate 20.

Step 103, forming a buffer layer 23.

Step 104, forming a semiconductor layer 241 and a second electrode 242 of the storage capacitor arranged at a same layer.

Step 105, forming a gate insulation layer 25.

Step 106, forming a gate electrode 26.

Step 107, forming an interlayer insulation layer 27 including at least two inorganic insulation layers and at least one organic insulation layer laminated one on another, wherein both a layer proximate to the base substrate and a layer distal to the base substrate in the interlayer insulation layer are the inorganic insulation layers. In the embodiment of the present disclosure, the interlayer insulation layer 27 includes a first inorganic insulation layer 271, an organic insulation layer 272 and a second inorganic insulation layer 273 laminated one on another in that order.

Step 108, forming an interlayer insulation layer via-hole penetrating through the interlayer insulation layer 27 and a connection hole penetrating through the interlayer insulation layer 27 and the buffer layer 23, wherein the interlayer insulation layer via-hole is composed of a first via-hole H11 and a second via-hole H12 that are connected to each other, a lapping pattern is lapped with the gate electrode 26 through the first via-hole H11, and the lapping pattern is lapped with the second electrode 242 through the second via-hole H12.

Step 109, forming a source electrode 282, a drain electrode 283 and the lapping pattern 281, wherein at least part of the lapping pattern 281 is located in the interlayer insulation layer via-hole, and configured for lapping the gate electrode 26 and the second electrode 242, and the source electrode 282 is connected to the first electrode 22 through the connection hole.

In the embodiment of the present disclosure, a multi-layer structure including inorganic insulation layers and an organic insulation layer is used in the interlayer insulation layer of a manufactured top-gate display substrate. The organic insulation layer is located between inorganic insulation layers. Due to good fluidity and flexibility of the organic insulation layer, the crack penetrating through the interlayer insulation layer at the position outside a slope of the gate electrode may not occur. Even if the crack occurs in the inorganic insulation layer of the interlayer insulation layer at the position outside the slope of the gate electrode, during etching a second inorganic insulation layer in a wet etching process, the HF etching solution may at the most reach the organic insulation layer and then be effectively blocked, so as to prevent the HF etching solution from etching the first electrode. Then the organic insulation layer and the first inorganic insulation layer underneath the organic insulation layer may be etched in a dry etching process, so as to successfully form the crack-free interlayer insulation layer via-hole. After the lapping pattern has been deposited in the interlayer insulation layer via-hole, the GSS defect may not occur, thereby significantly improving the display quality of the product.

Figure 12:
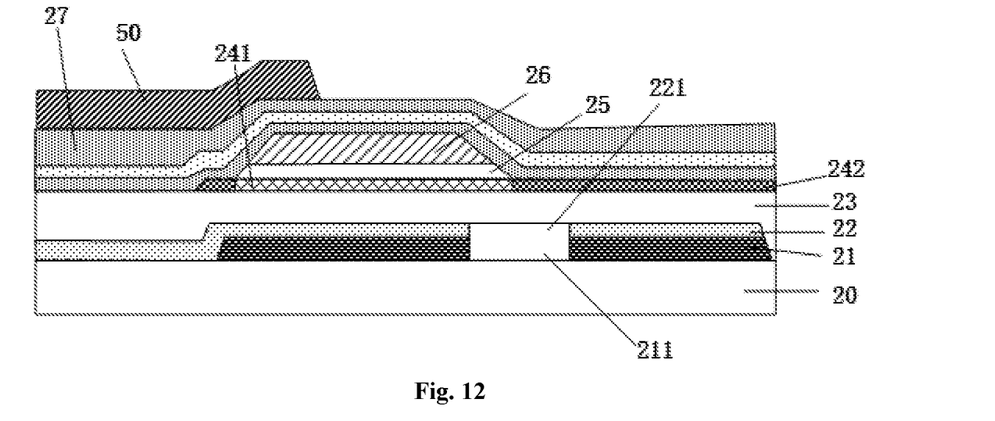
FIG. 12 to FIG. 14 are schematic diagrams of a method for manufacturing the array substrate according to an embodiment of the present disclosure.
Figure 13:
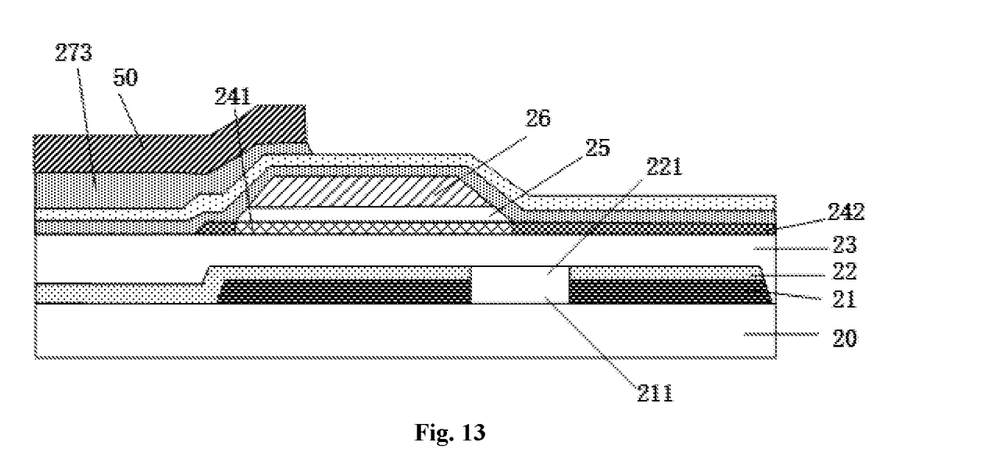
Figure 14:
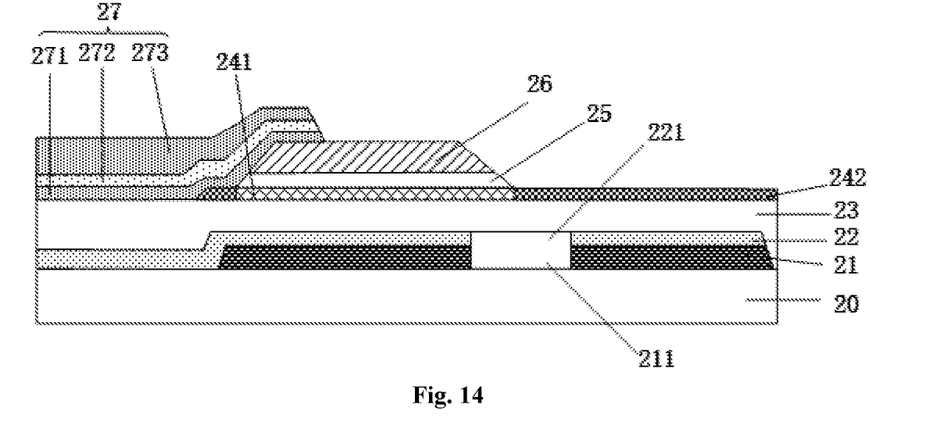

In the embodiment of the present disclosure, referring to FIG. 12 to FIG. 14, the forming the interlayer insulation layer via-hole penetrating through the interlayer insulation layer and the connection hole penetrating through the interlayer insulation layer and the buffer layer includes the following steps.

Step 1081, referring to FIG. 12, forming a photoresist pattern 50 on the second inorganic insulation layer 237.

Step 1082, referring to FIG. 13, etching the second inorganic insulation layer 273 that is not covered by the photoresist pattern 50 in an hydrofluoric acid (HF) wet etching process.

Since the etching is implemented quickly through the HF wet etching process, and the photoresist may not be damaged by the HF wet etching process, and the organic insulation layer may not be etched, the upper second inorganic insulation layer 273 may be etched in the HF wet etching process.

Step 1083, referring to FIG. 14, etching the organic insulation layer 272 and the first inorganic insulation layer 271 that are not covered by the photoresist pattern 50 in a dry etching process, to form the connection hole and the interlayer insulation layer via-hole.

In this step, a dry etching process is used. Even if the crack occurs in the first inorganic insulation layer at the position outside the slope of the gate electrode, the etching solution is prevented from flowing into the crack because the dry etching process is used.

In the embodiments of the present disclosure, optionally, referring to the structure of the array substrate in FIG. 9, the forming the first electrode of the storage capacitor on the base substrate includes: forming a first hollowed-out pattern 221 in the first electrode 22, wherein an orthographic projection of the first hollowed-out pattern 221 onto the base substrate 20 at least partially overlaps an orthographic projection of the second via-hole H12 onto the base substrate 20. Optionally, the orthographic projection of the first hollowed-out pattern 221 onto the base substrate 20 partially overlaps an orthographic projection of the first via-hole H11 onto the base substrate 20.

In the embodiments of the present disclosure, optionally, referring to the structure of the array substrate in FIG. 9, prior to the forming the first electrode of the storage capacitor on the base substrate, the method further includes: forming a light-shielding layer 21, and forming a second hollowed-out pattern 211 in the light-shielding layer 21, wherein the first electrode 22 is lapped with the light-shielding layer 21, an orthographic projection of the second hollowed-out pattern 211 onto the base substrate 20 at least partially overlaps the orthographic projection of the second via-hole H12 onto the base substrate 20. Optionally, the orthographic projection of the second hollowed-out pattern 211 onto the base substrate 20 partially overlaps an orthographic projection of the first via-hole H11 onto the base substrate 20. The orthographic projection of the second hollowed-out pattern 211 onto the base substrate 20 may coincide with or partially overlap the orthographic projection of the first hollowed-out pattern 221 onto the base substrate 20, and the orthographic projection of the semiconductor layer 241 onto the base substrate 20 is located within the orthographic projection of the light-shielding layer 21 onto the base substrate 20.

The embodiments of the present disclosure are described above with reference to the accompanying drawings. However, the present disclosure is not limited to the foregoing specific implementations. The foregoing specific implementations are merely illustrative rather than limitative. In light of the teachings of the present disclosure, a person skilled in the art may further make various modifications without departing from the spirit of the present disclosure and the scope of the claims, and these modifications also fall within the scope of the present disclosure.

What is claimed is:

1. An array substrate, comprising:
   a base substrate, and
   a thin film transistor, a storage capacitor and a lapping pattern arranged on the base substrate, wherein the lapping pattern is configured for connecting the thin film transistor to the storage capacitor;
   wherein the thin film transistor comprises a semiconductor layer, a gate insulation layer, a gate electrode, an interlayer insulation layer, a source electrode and a drain electrode arranged sequentially in that order;
   the interlayer insulation layer comprises at least two inorganic insulation layers and at least one organic insulation layer laminated one on another, and both a layer proximate to the base substrate and a layer distal to the base substrate in the interlayer insulation layer are the inorganic insulation layers;
   wherein the lapping pattern is arranged at a same layer as the source electrode and the drain electrode, and connected to the gate electrode and the second electrode through an interlayer insulation layer via-hole in the interlayer insulation layer, the interlayer insulation layer via-hole is composed of a first via-hole and a second via-hole that are connected to each other, the lapping pattern is lapped with the gate electrode through the first via-hole, and the lapping pattern is lapped with the second electrode through the second via-hole.

2. The array substrate of claim 1, wherein the interlayer insulation layer comprises a first inorganic insulation layer, an organic insulation layer and a second inorganic insulation layer laminated one on another in that order.

3. The array substrate of claim 1, wherein the storage capacitor comprises: a first electrode and a second electrode, the second electrode is arranged on a side of the first electrode distal to the base substrate, the source electrode is connected to the first electrode, and the second electrode is arranged at a same layer as the semiconductor layer.

4. The array substrate of claim 1, wherein the first electrode is provided with a first hollowed-out pattern, and an orthographic projection of the first hollowed-out pattern onto the base substrate at least partially overlaps an orthographic projection of the second via-hole onto the base substrate.

5. The array substrate of claim 4, wherein the orthographic projection of the first hollowed-out pattern onto the base substrate partially overlaps an orthographic projection of the first via-hole onto the base substrate.

6. The array substrate of claim 4, further comprising:
a light-shielding layer, arranged on a side of the semiconductor layer proximate to the base substrate, wherein an orthographic projection of the semiconductor layer onto the base substrate is located within an orthographic projection of the light-shielding layer onto the base substrate, the first electrode is lapped with the light-shielding layer, the light-shielding layer is provided with a second hollowed-out pattern, an orthographic projection of the second hollowed-out pattern onto the base substrate at least partially overlaps the orthographic projection of the second via-hole onto the base substrate.

7. The array substrate of claim 6, wherein the orthographic projection of the second hollowed-out pattern onto the base substrate partially overlaps an orthographic projection of the first via-hole onto the base substrate.

8. The array substrate of claim 6, wherein the first hollowed-out pattern penetrates through the first electrode, the second hollowed-out pattern penetrates through the light-shielding layer, and the orthographic projection of the first hollowed-out pattern onto the base substrate at least partially overlaps the orthographic projection of the second hollowed-out pattern onto the base substrate.

9. A display device, comprising the array substrate of claim 1.

10. The display device of claim 9, wherein the interlayer insulation layer comprises a first inorganic insulation layer, an organic insulation layer and a second inorganic insulation layer laminated one on another in that order.

11. The display device of claim 9, wherein the storage capacitor comprises: a first electrode and a second electrode, the second electrode is arranged on a side of the first electrode distal to the base substrate, the source electrode is connected to the first electrode, and the second electrode is arranged at a same layer as the semiconductor layer.

12. The display device of claim 11, wherein the first electrode is provided with a first hollowed-out pattern, and an orthographic projection of the first hollowed-out pattern onto the base substrate at least partially overlaps an orthographic projection of the second via-hole onto the base substrate.

13. The display device of claim 12, wherein the orthographic projection of the first hollowed-out pattern onto the base substrate partially overlaps an orthographic projection of the first via-hole onto the base substrate.

14. A method for manufacturing an array substrate, comprising:
providing a base substrate;
forming a first electrode of a storage capacitor on the base substrate;
forming a buffer layer;
forming a semiconductor layer and a second electrode of the storage capacitor arranged at a same layer;
forming a gate insulation layer;
forming a gate electrode;
forming an interlayer insulation layer comprising at least two inorganic insulation layers and at least one organic insulation layer laminated one on another, wherein both a layer proximate to the base substrate and a layer distal to the base substrate in the interlayer insulation layer are the inorganic insulation layers;
forming an interlayer insulation layer via-hole and a connection hole, wherein the interlayer insulation layer via-hole penetrates through the interlayer insulation layer, the connection hole penetrates through the interlayer insulation layer and the buffer layer, the interlayer insulation layer via-hole is composed of a first via-hole and a second via-hole that are connected to each other, a lapping pattern is lapped with the gate electrode through the first via-hole, and the lapping pattern is lapped with the second electrode through the second via-hole;
the lapping pattern is arranged at a same layer as a source electrode and a drain electrode; and
forming the source electrode, the drain electrode and the lapping pattern, wherein at least part of the lapping pattern is located in the interlayer insulation layer via-hole, and configured for lapping the gate electrode and the second electrode, and the source electrode is connected to the first electrode through the connection hole.

15. The method of claim 14, wherein the interlayer insulation layer comprises a first inorganic insulation layer, an organic insulation layer and a second inorganic insulation layer laminated one on another in that order.

16. The method of claim 15, wherein the forming the interlayer insulation layer via-hole and the connection hole comprises:
forming a photoresist pattern on the second inorganic insulation layer;
etching the second inorganic insulation layer that is not covered by the photoresist pattern through an hydrofluoric acid (HF) wet etching process; and
etching the organic insulation layer and the first inorganic insulation layer that are not covered by the photoresist pattern through a dry etching process, to form the connection hole and the interlayer insulation layer via-hole.

17. The method of claim 15, wherein the forming the first electrode of the storage capacitor on the base substrate comprises:
forming a first hollowed-out pattern in the first electrode, wherein an orthographic projection of the first hollowed-out pattern onto the base substrate at least partially overlaps an orthographic projection of the second via-hole onto the base substrate.

18. The method of claim 17, wherein prior to the forming the first electrode of the storage capacitor on the base substrate, the method further comprises:
forming a light-shielding layer, and forming a second hollowed-out pattern in the light-shielding layer, wherein the first electrode is lapped with the light-shielding layer, an orthographic projection of the second hollowed-out pattern onto the base substrate at least partially overlaps the orthographic projection of the first hollowed-out pattern onto the base substrate, and an orthographic projection of the semiconductor layer onto the base substrate is located within an orthographic projection of the light-shielding layer onto the base substrate.

* * * * *